United States Patent
Lane et al.

(10) Patent No.: US 12,261,017 B2
(45) Date of Patent: Mar. 25, 2025

(54) RESONANT ANTENNA FOR PHYSICAL VAPOR DEPOSITION APPLICATIONS

(71) Applicant: Tokyo Electron Limited, Tokyo (JP)

(72) Inventors: Barton Lane, Tokyo (JP); Masaki Takagi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 182 days.

(21) Appl. No.: 17/971,394

(22) Filed: Oct. 21, 2022

(65) Prior Publication Data
US 2024/0136151 A1    Apr. 25, 2024
US 2024/0234089 A9    Jul. 11, 2024

(51) Int. Cl.
| | |
|---|---|
| *H01J 37/32* | (2006.01) |
| *C23C 14/35* | (2006.01) |
| *H01L 21/02* | (2006.01) |
| *H01Q 5/10* | (2015.01) |

(52) U.S. Cl.
CPC ........ *H01J 37/3211* (2013.01); *C23C 14/354* (2013.01); *H01L 21/0228* (2013.01); *H01Q 5/10* (2015.01)

(58) Field of Classification Search
None
See application file for complete search history.

(56) References Cited

U.S. PATENT DOCUMENTS

| | | | |
|---|---|---|---|
| 4,675,691 A * | 6/1987 | Moore ..................... | H01Q 9/28 343/908 |
| 6,508,198 B1 * | 1/2003 | Hoffman ........... | H01J 37/32183 156/345.48 |
| 2002/0033328 A1 | 3/2002 | Stimson | |
| 2010/0237777 A1 | 9/2010 | Kim et al. | |
| 2010/0244204 A1 * | 9/2010 | Matsuoka ........... | H01J 37/3244 257/632 |
| 2016/0071701 A1 | 3/2016 | Lane | |
| 2021/0183619 A1 * | 6/2021 | Patrick ..................... | H01Q 1/36 |

FOREIGN PATENT DOCUMENTS

| | | |
|---|---|---|
| JP | 2006-274389 A | 10/2006 |
| KR | 1020130043795 A | 5/2013 |
| WO | WO-9927153 A1 * | 6/1999 ........... C23C 14/046 |

OTHER PUBLICATIONS

International Search Report and Written Opinion on PCT App. PCT/US2023/029371 dated Nov. 21, 2023 (11 pages).

* cited by examiner

*Primary Examiner* — Alexander M Weddle
(74) *Attorney, Agent, or Firm* — Foley & Lardner LLP

(57) ABSTRACT

Systems and methods provide a solution for efficiently generating high density plasma for a physical vapor deposition (PVD). The present solution includes a vacuum chamber for a PVD process. The system can include a target located within the vacuum chamber for sputtering a material onto a wafer. The system can include a resonant structure formed by an antenna and a plurality of capacitors. The resonant structure can be configured to provide a pulsed output at a resonant frequency. The resonant structure can be configured to generate, via the antenna and based on the pulsed output, a plasma between the target and a location of the wafer to ionize the material sputtered from the target.

20 Claims, 7 Drawing Sheets

RESONANT ANTENNA FOR PHYSICAL VAPOR DEPOSITION APPLICATIONS

TECHNICAL FIELD

This disclosure related to semiconductor equipment for depositing materials in devices, such as semiconductor transistors and integrated circuits.

BACKGROUND

Semiconductor device fabrication relies on different manufacturing processes for creating and modifying different parts of semiconductor circuits. These processes can include film-forming depositions, doping treatments, etch mask creation, patterning and material etching and removal. The processes can be performed using different semiconductor equipment systems, some of which can be particularly designed for specific fabrication steps. The performance of semiconductor fabrication systems can rely on their speed and efficiency as well as their repeatability and uniformity.

SUMMARY

Physical vapor deposition (PVD) can refer to a process of producing thin films or coatings on substrates through material sputtering or evaporation in a vacuum environment. During a PVD process, materials can be sputtered from a target to which power is applied in order to remove some of the material to be used to create a thin film on a substrate. The PVD particles removed from the target can be neutrally charged (e.g., non-ionized) and emitted from the target with an angular distribution that is approximately a cosine function of the angle from perpendicular or normal to the target. Sometimes, in order to increase the directionality and control of the particles of the sputtered PVD material, the sputtered particles can be ionized by plasma. Ionized PVD material particles can be accelerated towards a substrate whose voltage potential can be set to a charge that is opposite to the one of the ionized scattered PVD particles. This ionization process can result in the PVD particles being attracted to and accelerated towards the substrate. The ionized PVD particles can hit and stick to the substrate, thereby forming a uniform film of the material.

When forming PVD thin films on substrates that have deep trenches, ionization and directionality of PVD particles becomes particularly helpful since it can be challenging to form uniform PVD films within trenches using non-ionized PVD particles. Specifically, as non-ionized PVD sputtered particles have very high scatter angles, the non-ionized PVD sputtered particles can be unevenly deposited on top of the trenches, the entrance into the trench and preventing subsequent PVD particles from going inside the trenches, which can create an unfilled hole inside the trench, potentially causing adverse effects on the circuit performance.

One way to address this problem is to ensure that PVD sputtered particles are ionized with plasma to allow for their directional acceleration towards the substrate. This directional acceleration can reduce the scatter angles of the PVD particles, thereby allowing for improved control and more uniform deposition of the PVD particles within the deep trenches, holes and other hard to reach areas of the substrate. However, in order to achieve ionization of PVD sputtered particles, high-density plasma is generated between the non-ionized PVD particles and the substrate, which can be challenging to achieve within the context of semiconductor manufacturing in view of the vacuum chamber limitations in the context of power coupling for plasma generation.

The present solution provides systems and methods for generating high-density plasma within a vacuum chamber of a PVD system using an antenna of a resonant structure. The antenna can induce the plasma by operating at a resonant frequency of the structure. The present solution can allow for the resonant structure to be wholly or partially located within or outside of the vacuum chamber, thereby allowing for power coupling to be achieved through the vacuum chamber walls.

The present solution relates to a system, such as a PVD tool, for semiconductor device fabrication. The system can include a vacuum chamber for physical vapor deposition (PVD). The system can include a target located within the vacuum chamber for sputtering a PVD material onto a wafer. The system can include a resonant structure formed by an antenna and one or more capacitors. The resonant structure can be configured to provide a pulsed output at a resonant frequency of the resonant structure. The resonant structure can be configured to generate, via the antenna and based on the pulsed output, a plasma between the target and a location of the wafer to ionize the PVD material sputtered from the target.

The system can include the wafer that is electrically charged to accelerate the sputtered PVD material ionized by the plasma. The system can include the antenna that is configured to induce a mirror current in the plasma that heats electrons, and thus sustains the plasma. The system can include at least a portion of the plurality of capacitors that is located outside of the vacuum chamber.

The system can include a post electrically connecting a plate of a capacitor of the plurality of capacitors with the antenna. The system can include a feed through surrounding the post and insulating a pressure within the vacuum chamber from a pressure of external ambient air. The system can include at least a part of the antenna that is located within the vacuum chamber. The system can include at least a part of the antenna is located outside of the vacuum chamber.

The system can include at least a part of the antenna that is enclosed within alumina material and where at least a portion of the alumina material that is exposed to interior of the vacuum chamber. The resonant structure may be configured to operate at a resonant frequency. The resonant frequency can be at least in part defined by the inductance of the antenna and the capacitance of the one or more capacitors.

The system can include the resonant structure that is configured to generate, via the antenna, one of a magnetic field or an electric field at the resonant frequency. The magnetic field or the electric field of the antenna can generate the plasma. The one or more capacitors may be two capacitors that are electrically connected with each other in a series electrical connection. The two capacitors can be electrically connected with the antenna in a series electrical connection.

The system can include the antenna that is axisymmetric and that generates plasma with azimuthal symmetry with respect to the antenna. The antenna can include a geometry that is at least partly symmetric about an axis and generates plasma based on geometry of the antenna. The antenna structure may include at least two circular elements. The two circular elements can be connected with each other by elongate connectors. The system can include two circular elements that are concentric and coplanar with each other. The elongate connectors can be curved and can form a spiral shape between the two circular elements. The system can include the antenna and the one or more capacitors that are located within the vacuum chamber. The system can further include one or more shields for protecting at least a portion of the plurality of capacitors. The system can include the antenna and the plurality of capacitors that are shaped into a cylinder inside of the vacuum chamber and the resonant structure that is configured to form the plasma within an interior cavity of the cylinder.

The present solution may include a method that provides, by a resonant structure formed by an antenna and one or more capacitors, a pulsed output at a resonant frequency of the resonant structure. The method can include coupling, to a target within a vacuum chamber for physical vapor deposition (PVD), power to sputter a PVD material. The antenna may generate a plasma between the target and a location of the wafer based on the pulsed output. The PVD material sputtered from the target may be ionized by the plasma.

The method can further include electrically charging the wafer to attract the sputtered PVD material ionized by the plasma and coating the wafer with a layer of ionized PVD material. The method can include inducing a mirror current within the plasma around the antenna to generate heat and sustain the plasma. The method can include generating, by the antenna of the resonant structure, one of a magnetic field or an electric field at the resonant frequency, the one of the magnetic field or the electric field generating the plasma.

These and other aspects and implementations are described in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the present disclosure can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
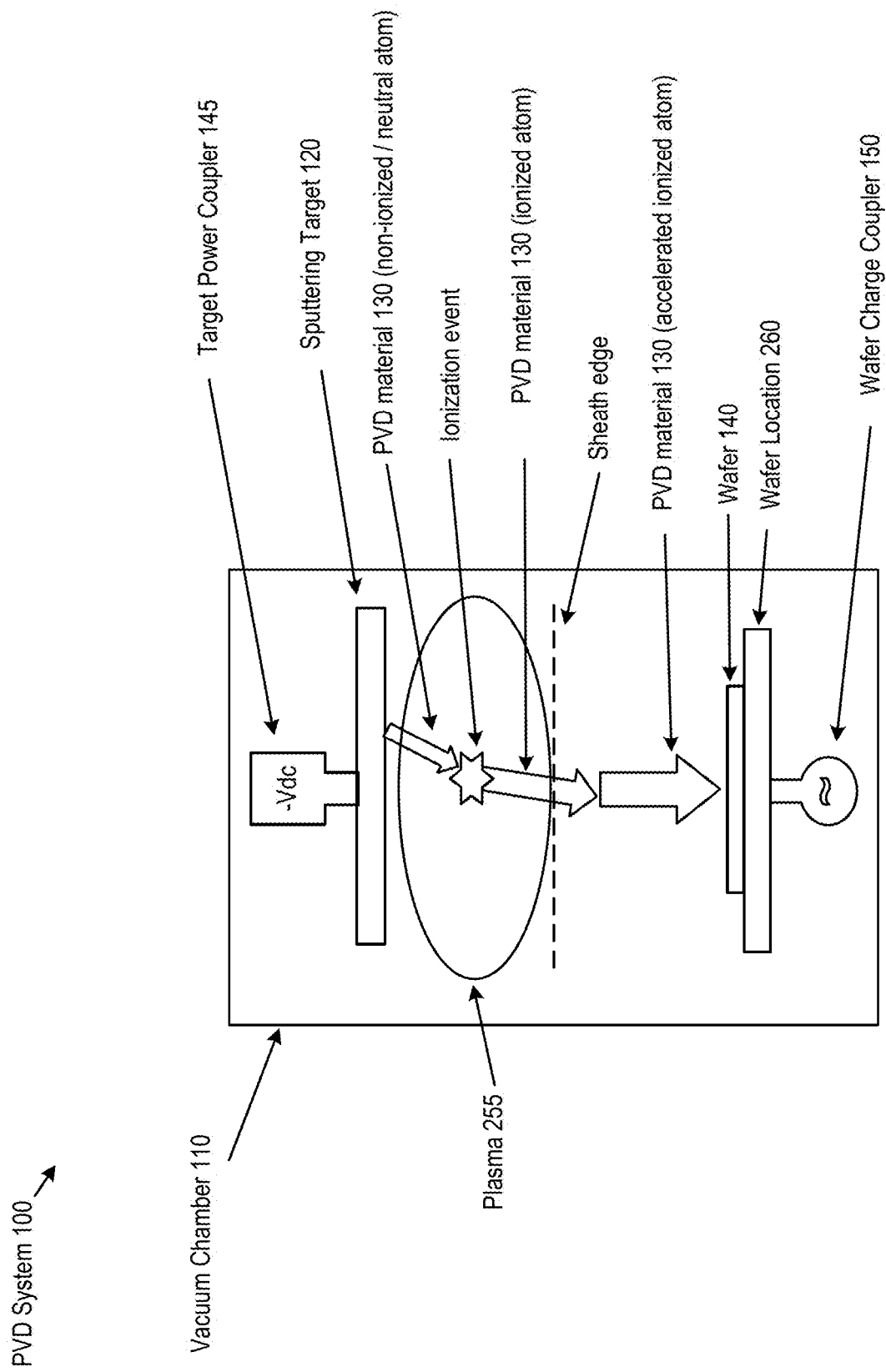
FIG. 1 includes a diagram of an example physical vapor deposition (PVD) process in a PVD system, in accordance with one or more embodiments.

Reference will now be made to various illustrative embodiments depicted in the drawings, and specific language will be used to describe the same. It will nevertheless be understood that no limitation of the scope of the claims or this disclosure is thereby intended. Alterations and further modifications of the inventive features illustrated herein, and additional applications of the principles of the subject matter illustrated herein, which would be apparent to one of ordinary skill in the relevant art having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

It is understood that apparatuses, systems and devices described herein can be used or find their application in, or in connection with, any number of systems or devices utilizing features described herein, such as for example, any semiconductor equipment manufacturing tools or any electrical or electronic devices utilizing plasma.

The embodiments described herein may enable a high-density plasma (e.g., greater than about 4e11 $cm^{-3}$ at 300 W) generation and can be used with, or within, any number of systems, tools or devices that generate or utilize plasma. For example, the embodiments of the present solution can be used in semiconductor equipment PVD systems or tools, plasma surface cleaning systems or tools, plasma surface treatment systems or tools, plasma coating systems or tools, plasma burners or incinerators, and more.

The components and features of the present solution discussed herein are not limited to only the configurations and arrangements illustrated or used as examples in the present disclosure. Rather, all components and features discussed herein are rather can be arranged, interconnected or otherwise used in any variety of configurations and arrangements. For example, vacuum chambers, posts, feedthrough components, antennas, capacitors, resonant structures, targets, wafers and wafer locations, as well as any other features discussed herein, can be arranged or interconnected in any combination, illustrated or otherwise.

Any power, voltage or current described herein, having a positive or a negative polarity or charge, can include the same or a different (e.g., opposite) polarity of the one described in the example. For example, any power coupled at a negative voltage can also anticipate or cover examples of power coupled at a positive voltage. For example, any negative currents or charges can also denote positive currents or positive charges.

Any electrical circuits or structures can include variations beyond those shown in the illustrated examples. For example, any example of a resonant structure described herein that includes inductive and capacitive components (e.g. an LC structure or a circuit), can also encompass, include, or be replaced with, resistive, inductive and capacitive structures (e.g., RLC structures or circuits), resistive and capacitive structures (e.g., RC structures or circuits) or resistive and inductive structures (e.g., RL structures or circuits). For example, a resonant structure whose resonant frequency is based on inductive and capacitive components can also contemplate designs in which inductive, capacitive, and resistive components are used. Also, any electrical components (e.g., capacitors, inductors, resistors, or similar) shown or described in the examples or illustrated embodiments as connected in series can also include examples that are connected in parallel or in any combination of series and parallel connections.

Plasma described herein can include, for example, one of the four fundamental states of matter. Plasma can include a significant portion of charged particles, such as ions (e.g., ionized atoms or molecules) and/or electrons. Plasma can include gas that is electrically conductive. Plasma can be generated by subjecting the gas to an electromagnetic field that heats free electrons, thereby producing more free electrons. Dynamics of individual particles within plasma and macroscopic plasma motion can be affected and controlled by external electromagnetic fields, such as the electric or magnetic fields generated by an antenna or a resonant structure.

Reference will now be made to the Figures, which for the convenience of visualizing of the present solution can include various high-level or detailed and specific diagrams, sketches and illustrations of the features or embodiments of the present solution. Unless expressly indicated otherwise, each Figure represents one (or a set) of embodiments of a design or a solution. In the perspective or cross-sectional views of the Figures, various components can be shown in simplified version. However, it should be understood that these components can include various sizes, shapes and designs, as the illustrated examples are merely illustrative, and are intended to show a capability of the solution, and not be considered limiting to the scope of the claims. Conversely, when example illustrations do not show particular features or components, it is understood that such features or components can be made or filled in, in accordance with the understanding of the subject matter by a person of ordinary skill in the relevant field.

A PVD process can be used, for example, in semiconductor device fabrication for depositing thin film materials onto substrates having various microscopic semiconductor circuit features. During a PVD process, a sputtering target component within a vacuum chamber of a PVD system can be subjected to a high concentration of power or energy that can cause the PVD material to be sputtered from the target. Sputtered PVD material can include materials with high sticking coefficients, such as metals that can adhere to the intended substrate. As sputtered PVD material (e.g., sputtered atoms) are normally emitted as neutrally charged (e.g., non-ionized) particles, the sputtered PVD material can move at very high scatter angles, the scatter angle being measured relative to being perpendicular or normal to the face of the target. The high scatter angles of the sputtered PVD material can make it difficult to form a uniform thin film, especially within uneven surfaces or within trenches, holes and other hard to reach areas. In order to decrease the scatter angles of the sputtered PVD material particles and improve their directionality, these particles can be passed through a plasma. The plasma can ionize the PVD material particles, thereby making the PVD material particles electrically charged and attracted to the wafer, which can be set to an electrical charge of the opposite polarity to the polarity of the ionized PVD material particles. As a result, the ionized sputtered PVD particles can be directionally directed to the surface of the wafer substrate at low or reduced scatter angles, so as to improve the uniformity and control of the thin film formed and allow for deposition of the ionized sputtered PVD particles within thin deep trenches, holes and other hard to reach areas of the substrate.

The present solution provides systems and methods for efficiently producing plasma at high densities of between about $1e11$ $cm^{-3}$ and about $1e13$ $cm^{-3}$ at power levels of between about 300 W and 60 kW of CW or instantaneous power at 10% duty cycle. For example, the present solution can provide plasma density of about $4e11$ $cm^{-3}$ at 300 W. For example, the present solution can include a high-power impulse magneton sputtering (HiPIMS) system configuration with a pulsed magnetron applied to target at DC instead of CW at instantaneous power of about 60 kW at 10% duty cycle to produce plasma density of about $1e13$ $cm^{-3}$.

To achieve these results, the present solution can have a number of configurations. One configuration can use a resonant and axisymmetric antenna that wraps around or surrounds the sputtering target in the vacuum chamber to generate plasma via inductively coupled plasma (ICP) coupling. The shape of the antenna can be circular, oval, rectangular, square or any other shape. Using ICP coupling, the antenna can generate an alternating magnetic field that produces alternating electric field, which results in a spatially uniform plasma around the sputtering target. The generated plasma can be formed between the sputter target and the wafer substrate, thus ionizing sputtered PVD material from the target on its way to the substrate. The ICP coupling can allow for high plasma density which can improve or increase the sputter rate of the target.

The shape of the antenna can be symmetric and centered around the sputtering target and can allow for azimuthal symmetry and uniformity of the plasma generated between the target and the wafer. The antenna can be powered or driven either capacitively or inductively. The antenna power source or driver can be located on the atmosphere side of the chamber wall and be coupled to the antenna through the chamber wall. The coupling can be electrostatic and can utilize a match box circuit comprising any combination of one or more inductive, resistive, and capacitive components to improve the gain efficiency of the resonant structure. The present solution can allow for a fully-floating antenna structure, such as an antenna that is a part of an LC resonant structure, where the antenna can be disposed within the vacuum chamber. The remaining parts of the LC resonant structure, such as for example the capacitors, can be external to the vacuum chamber and electrically coupled with the antenna through the vacuum chamber wall. In some implementations, the entire resonant structure (e.g., including the antenna and the capacitors) can be internal to the vacuum chamber, external to the vacuum chamber, or partially internal and partially external with respect to the vacuum chamber.

Referring now to FIG. 1, illustrated is a diagram of an example physical vapor deposition (PVD) process that can take place in a PVD system 100 of the present solution. A PVD system 100 can include a vacuum chamber 110 inside of which the PVD process can be performed. A target power coupler 145 can couple electrical power to a sputtering target 120. The electrical power coupled by the target power coupler 145 can be at a negative or a positive voltage to activate sputtering of the PVD material 130 from the sputtering target 120. The sputtering target 120, also referred to as the target 120, can sputter PVD material 130 at high dispersion angles into the interior of the vacuum chamber 110. Sputtered PVD material 130 can include non-ionized (e.g., neutrally charged) particles, including for example atoms or molecules from the target 120. The non-ionized PVD material 130 particles can be sputtered into a volumetric region within the vacuum chamber 110 in which plasma 255 is generated. Inside plasma 255, sputtered PVD material 130 particles can be ionized by ionization events 134, which can include interactions or collisions with various charged particles and/or electrons. At ionization events 134, PVD material 130 particles can become positively or negatively charged (e.g., ionized). Once ionized, the particles of the PVD material 130 (e.g., ionized atoms) can be attracted by a wafer location 260 and/or the wafer 140 due to their charge or voltage potential that can be set to an opposite charge or voltage potential from that of the ionized particles of the PVD material 130. Ionized particles of the PVD material 130 can then traverse the sheath edge 132 of the plasma 255 region and move towards the wafer location 260 and/or the wafer 140. The charge or the voltage potential of the wafer location 260 and/or wafer 140 can be set up or configured by the wafer charge coupler 150 to be at the voltage potential to attract ionized particles of the PVD material 130. The wafer charge coupler can provide either CW, DC, RF or pulsed DC power in order to set the potential of the wafer so that the wafer attracts ionized sputter material particles. Ionized PVD material 130 particles can then accelerate towards and stick to the wafer 140 (and the wafer location 260) coating the wafer 140 with a thin film of particles of the PVD material 130.

PVD system 100 can include any tool, system or a device performing a PVD process. For example, PVD system 100 can include a semiconductor equipment tool or a system for depositing material during the process of a semiconductor circuit fabrication. For example, PVD system 100 can include a cathodic arc deposition system, an electron-beam physical vapor deposition system, an evaporative deposition system, a close-space sublimation system, a pulsed laser deposition system, a sputter deposition system or a pulsed electron deposition system. A PVD system 100 can include an equipment, system or a tool that utilizes plasma 255 for any purpose, including surface treatment, surface cleaning, PVD process, burning or incineration or any other process relying on plasma 255.

Plasma 255 can include a state of matter that can be formed by adding energy to a gas. For example 255 can include gas molecules that became ionized and carrying a net positive charge. Plasma can include a mix of positive charged ions and negatively charged electrons. Plasma 255 can include a sufficient volumetric concentration of ionized particles (e.g., molecules, atoms or electrons) to become electrically conductive or have an electrical resistance that is lower than that of air at standard atmospheric pressure. Plasma 255 can include a high concentration of ions and electrons within a volumetric region that can be defined by the external electromagnetic field, such as the field induced or provided by an antenna 205 (illustrated and described later in connection with FIG. 2 and other Figures). Plasma 255 can also include mirror currents 275 inside of the plasma 255, further discussed in FIGS. 5-7. As will be described later, mirror currents 275 be formed from the ions or electrons in the plasma 255 and can be shaped based on the geometry of currents of the antenna 205 and therefore conform to the shape of the antenna 205.

Target power coupler 145 can include any device, system, component or any combination of hardware and software for providing or coupling power, voltage or current to a sputtering target 120 or triggering sputtering of PVD material 130 from the sputtering target 120. Target power coupler 145 can include any combination of electrical circuitry and conductors for providing a set amount of power, voltage or current. Target power coupler 145 can include a power supply, a laser, or any device to deliver a concentrated power to a sputtering target 120 to cause sputtering of material. Target power coupler 145 can provide a direct current (DC) or constant power output, depending on the design. Target power coupler 145 can provide alternating current (AC) power. Target power coupler 145 can provide constant voltage or power or an alternating voltage or power. Target power coupler 145 can provide pulsed voltage, current or power, including pulsed power at any duty cycle.

Wafer charge coupler 150 can include any device, system, component or any combination of hardware and software for providing or coupling power, voltage or current to a wafer location 260 (FIG. 4) and/or wafer 140 or for establishing a voltage potential or charge to a wafer 140 and/or wafer location 260. Wafer charge coupler 150 can include any combination of electrical circuitry and conductors for providing a set amount of power, voltage or current. Wafer charge coupler 150 can include a power supply or any device to set the voltage potential of a wafer location 260 or wafer 140 to a particular charge or voltage potential. Wafer charge coupler 150 can provide a direct current (DC) or constant electrical power. Wafer charge coupler 150 can provide alternating current (AC) electrical power. Wafer charge coupler 150 can provide constant voltage or an alternating voltage. Wafer charge coupler 150 can provide pulsed voltage or current, including pulsed power at any duty cycle.

Sputtering target 120, or a target 120, can include any piece of material that can eject atoms or molecules from its surface when a surface of the target 120 is struck by a sufficiently high energy particles. Sputtering target 120 can comprise PVD material 130 in solid form and integrated into a single piece of solid material. The single piece of material can be struck by energy and cause the PVD material 130 to be sputtered. Sputtering target 120 can include any type and form of PVD material 130, such as, for example, Aluminum, Silver, Copper, Chromium, Hafnium, Indium Tin Oxide, Molybdenum, Niobium, Niobium Oxide, Niobium Titanium alloys and more. Sputtering target 120 can be electrically isolated from other parts of the PVD system 100, including vacuum chamber 110, for example.

Wafer location 260 can include any portion or a component of the PVD system 100 at which wafer 140 can be located during a PVD process. Wafer location 260 can positioned on an interior wall of a vacuum chamber 110 at an interior top surface, interior bottom surface or any of the interior side surfaces of the vacuum chamber 110. Wafer location 260 can include a mechanism for holding a wafer 140. Wafer location 260 can be electrically isolated from other components of the PVD system 100. Wafer location 260 can be electrically coupled to the wafer charge coupler 150, which can set its voltage potential to a positive or a negative voltage, so as to attract ionized particles of PVD material 130.

Wafer 140 can include any substrate, such as a semiconductor substrate, a metal substrate, a glass substrate, a ceramic substrate or a polymer substrate. Wafer 140 can include a silicon or a germanium substrate. Wafer 140 can include a plastic material, a sheet of metal, or a semiconductor wafer comprising any number of semiconductor circuits or any other substrate used in the industry.

PVD material 130 can include any material that can be sputtered in a PVD process. PVD material 130 can include material forming the target 120. For example, PVD material 130 can include one or more of: Gold, Silver, Palladium, Platinum, Aluminum, Antimony, Barium, Beryllium, Bismuth, Boron, Cerium, Chromium, Cobalt, Copper, Erbium, Gallium, Germanium, Indium, Iridium, Iron, Lead, Lithium, Magnesium, Nickel, Selenium, Silicon, Tin, Tungsten, Zinc, or any other material that can be used in a PVD process. PVD material 130 can include any combination of materials or molecules having multiple types of atoms, such as Aluminum Copper, Aluminum Nitride, Aluminum Silicon, Aluminum Silicon Copper, Boron Carbide, Cadmium Selenide, Gallium Arsenide, Gallium Nitride, Germanium Nitride, Germanium Oxide, Indium Tin Oxide and others.

The physical vapor deposition process as described in FIG. 1 may be implemented using a number of system configurations and processes performed by different configurations. For illustration purposes, four different embodiments are described hereinafter. It should be understood that alternative or combinations of the features of the different embodiments may be combined.

Example PVD System Configuration 1

Figure 2:
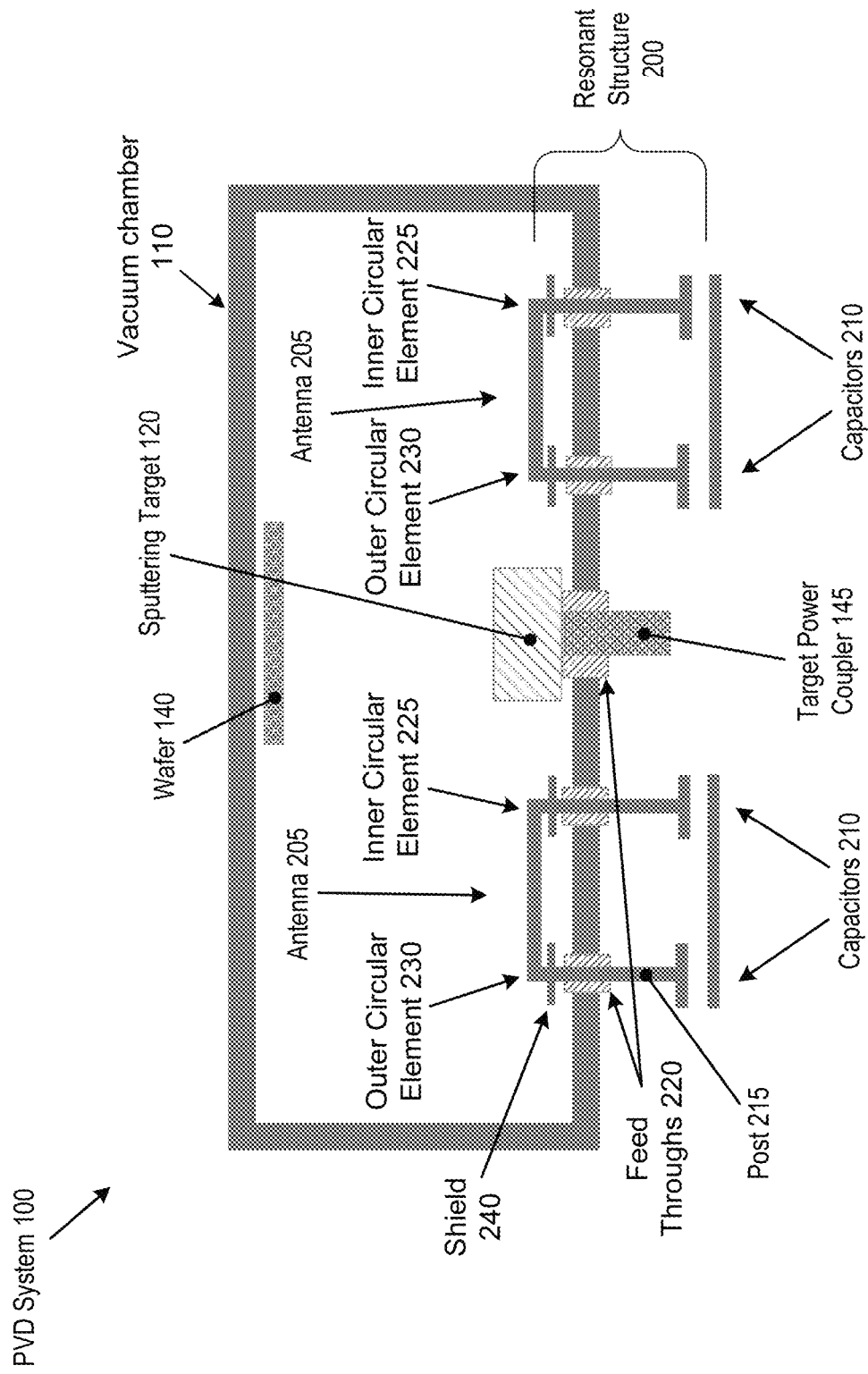
FIG. 2 includes an illustration of an example resonant structure of a PVD system, in accordance with one or more embodiments.
Figure 3:
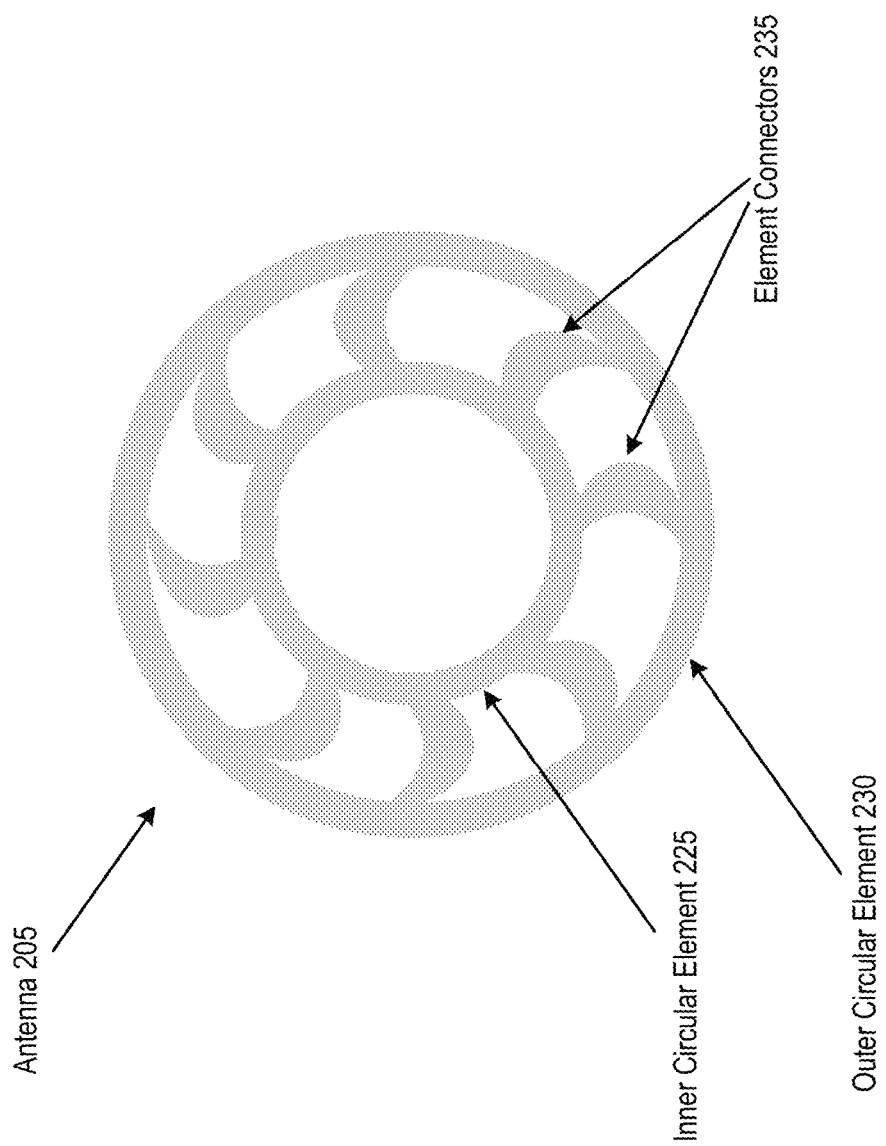
FIG. 3 includes an illustration of an example antenna of a resonant structure of a PVD system, in accordance with one or more embodiments.
Figure 4:
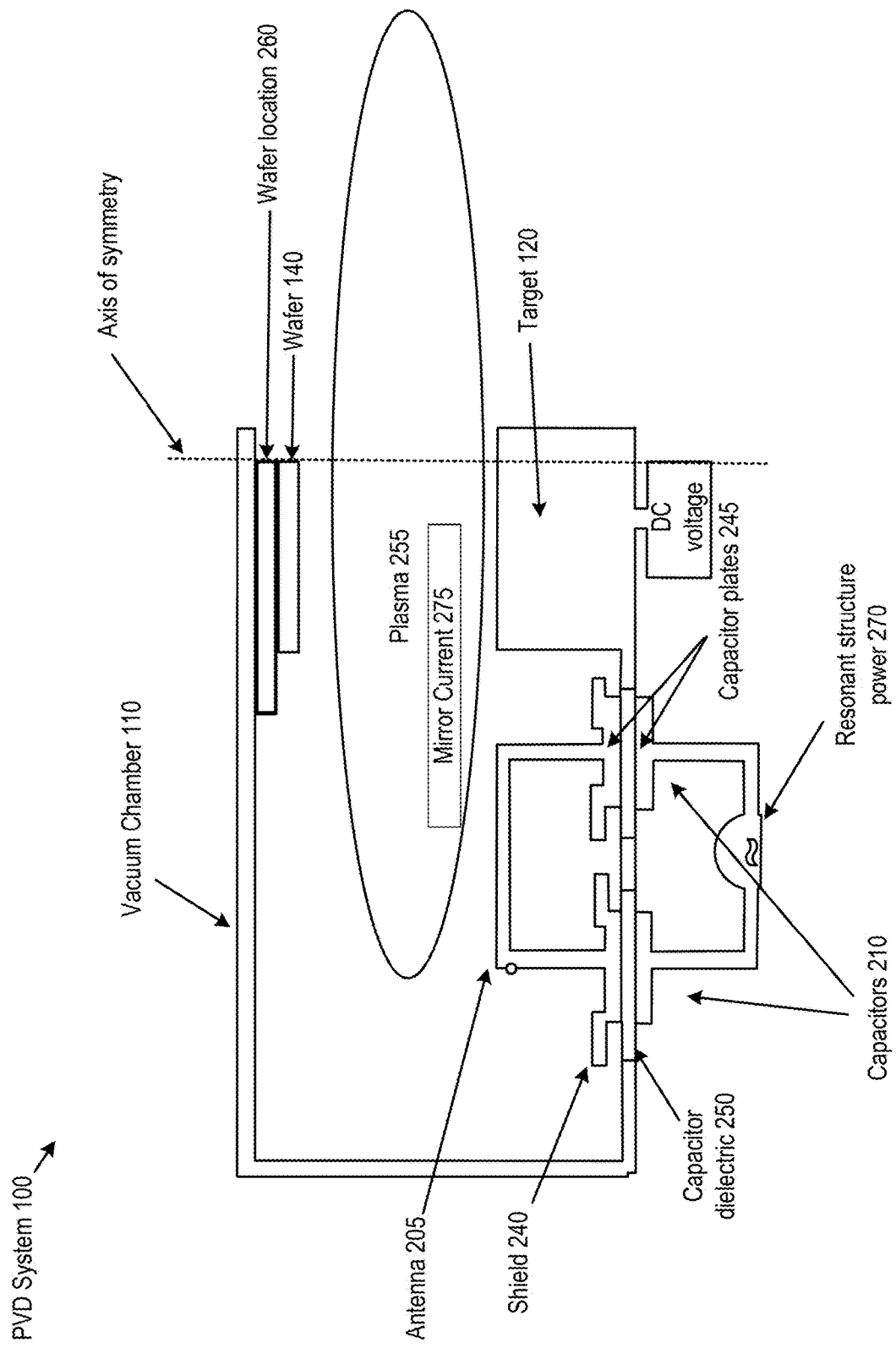
FIG. 4 includes a cross-sectional diagram of an example PVD system in which an antenna and a part of each of the capacitors is inside of a vacuum chamber and another part of the capacitors is outside of the vacuum chamber, in accordance with one or more embodiments.

The embodiment illustrated in FIGS. 2-4 shows a configuration in which the inductive portion of the resonant structure 200 is disposed within the vacuum chamber 110, while the capacitive portion of the resonant structure 200 is disposed outside of the vacuum chamber 110. In some implementations, the illustrated configuration can be turned upside down so that the wafer is below the target and the antenna. In some implementations, the configuration can be rotated 90 degrees from the illustrated example so that the wafer is oriented vertically.

FIG. 2 includes an illustration of an example resonant structure 200 of a PVD system 100. One or more antennas 205 and one or more capacitors 210 may be included as part of the resonant structure 200. The one or more antennas 205 and capacitors 210 can be electrically coupled with each other via one or more posts 215. Posts 215 can include electrically conductive materials, such as electrical conductor metals. Posts 215 can be inserted through a wall of the vacuum chamber 110. One or more antennas 205 of the resonant structure 200 can be located inside of the vacuum chamber 110 and one or more capacitors 210 of the same resonant structure 200 can be located outside of the vacuum chamber 110. Any of the one or more antennas 205 and capacitors 210 can be located inside of the vacuum chamber 110, outside of the vacuum chamber 110 or partially inside and partially outside of the vacuum chamber 110. Posts 215 can be surrounded by feed throughs 220, which insulate the interior gas pressure of the vacuum chamber 110 from the ambient pressure. For example, posts 215 can prevent the airflow via the openings in the wall of the vacuum chamber 110 through which posts 215 are inserted. By sealing the airflow, the feed throughs 220 can maintain the pressure differential between the pressure inside the vacuum chamber 110 and ambient pressure outside of the vacuum chamber. Shields 240 can protect posts 215 and feed-throughs 220 from incidental material deposition. A target power coupler 145 can be located outside of the vacuum chamber 110 and can be electrically coupled through the wall of the vacuum chamber 110 to the sputtering target 120 that is on the opposite side of the wall of the vacuum chamber 110 (e.g., inside the vacuum chamber 110).

Resonant structure 200 can include any structure or circuit that can operate at a resonant frequency. For example, a resonant frequency can be a natural frequency at which the amplitude of the current is at a maximum and the circuit would oscillate if not driven by a voltage source. For example, a resonant frequency can be a frequency at which the inductive and capacitive reactances are equal in magnitude. Resonant structure 200 can include inductive components or materials, such as coils or metal spiral-shaped structures, including, for example, an antenna 205. The antennal 205 can act as an inductor, which when coupled with capacitive structures 210 can form an LC resonant circuit. Resonant structure 200 can include capacitive components or materials, such as capacitors 210. Resonant structure 200 can include resistive components or materials, such as resistors or resistive films or structures. Resonant structure 200 can include any combination of inductive, capacitive and/or resistive structures or components. For example, resonant structure 200 can include any number of capacitors 210 (e.g. two capacitors 210) acting as capacitive components and any number of antennas 205 (e.g., an antenna 205) acting as inductive component. Resonant structure 200 can further include one or more resistive components. The two capacitors 210 and an antenna 205, with or without any additional resistive components, can be connected in series. In some implementations, any number of capacitors 210 and antennas 205 can be connected in series, parallel or any combination of series and parallel.

The resonant frequency of the resonant structure 200 can be defined by the electrical components of the resonant structure 200. For example, the resonant frequency can be defined by the capacitance and inductance of the resonant structure 200. Resonant structure 200 can have a resonant frequency defined by the capacitance, inductance, and resistance of the resonant structure 200 and components thereof. For example, resonant structure 200 can include any number of capacitors 210 and antennas 205 configured (e.g., electrically interconnected) to operate at a resonant frequency. For example, resonant structure 200 can include any number of resistive components, such as resistors, included in any part of the resonant structure 200, along with the capacitive and inductive components and defining the resonant frequency.

Each capacitor 210 can include any type and form of a capacitor or a structure having a capacitance. Capacitor 210 can include a parallel plate capacitor, such as a capacitor 210 having capacitor plates 245 that can be separated by a capacitor dielectric 250, such as the one shown in FIG. 4. Capacitor 210 can also include any other type and form of a capacitor, such as a ceramic capacitor, an electrolytic capacitor, a film and paper capacitor, a super capacitor, a silver mica capacitor, a glass capacitor, a tantalum capacitor a polycarbonate capacitor or any other capacitor or capacitive structure.

Referring now to FIG. 3, antenna 205 of the resonant structure 200 can include a symmetric structure that surrounds the sputtering target 120. Antenna 205 can be shaped as a circle, an oval, a rectangle, a square, a hexagon, an octagon or any other shape. Antenna 205 can include a shape that is symmetric about an axis that is perpendicular to the plane of the plane of the antenna (e.g., a plane in which the circle, oval, rectangle or hexagon of the antenna is disposed). Antenna 205 can include a shape that is symmetric about a plane, such as for example, a plane in which one half of the antenna 205 mirrors the other half of the antenna 205. Antenna 205 can include a geometry that is symmetric in two or more directions of 360 degrees about an axis of the antenna. For example, antenna 205 can be symmetric in specific angles, such as 360/n, where "n" is an integer. The integer can correspond to the number of elongate connectors 235 connecting two circular elements 225 and 230. For example, when observed from a stand point of the axis of symmetry and looking at several directions about the axis of symmetry, the antenna 205 can be symmetric in eight directions around the 360 degrees about the axis of the antenna 205 when the antenna includes eight elongate connectors 235 equally spaced between two circular elements 225 and 230. Antenna 205 can be coplanar with the top surface of the sputtering target 120 that faces the interior of the vacuum chamber 110. Antenna 205 can include an outer circular element 230 and an inner circular element 225. Inner and outer circular elements 225 or 230 can be shaped as a circle, ellipse, square, rectangle, hexagon, octagon or any polygon. The inner circular element 225 can surround or be wrapped around the sputtering target 120. The outer circular element 230 can be concentric and coplanar with the inner circular element 225. The outer circular element 230 can be spaced apart from the inner circular element 225. The outer and inner circular elements 230 or 225 can be concentric, coplanar and spaced apart from each other by an equal distance in all directions around the inner circular element 225. For example, inner circular element 225 can be within the outer circular element 230 and connected to the outer circular element 230 with one or more element connectors 235 that can have equal length and shape. The inner circular element 225 and the outer circular element 230 can be connected with each other by element connectors 235 that are curved and oriented in the same way around the inner circular element 225. For example, element connectors 235 can have the same length, same shape, same curvature and can be disposed in the same direction with respect to the center of the inner circular element 225, so as to form a symmetric circular shape around the inner circular element 225. Inner circular element 225, outer circular element 230 and element connectors 235 can include the same or a different material. For example, antenna 205 can include any electrically conductive material, such as aluminum, copper, iron, or any other electrical conductor.

Element connector 235 can include elongate components of the same or different material than the inner and outer circular elements 225 and 230. Element connectors 235 can include straight or curved elongate rods or components. Element connectors 235 can include elongate components curved into an arc of the same curvature and connecting the inner circular element 225 to the outer circular element 230. Element connectors 235 can form a spiral-like structure. The spiral-like structure can include curved element connectors 235 curved in identical curvature, oriented in the same direction around 225 the inner circular element and equally spaced apart from each other to form a symmetrical circular antenna 205 with an opening for the target 120 at its center.

Referring now back to FIG. 2 in conjunction to the features discussed in FIG. 3, curved and equally spaced element connectors 235 of the antenna 205 connecting the inner circular element 225 with the outer circular element 230 can be inserted inside of the vacuum chamber 110. Antenna 205 can be connected and electrically coupled with the capacitors 210 of the resonant structure 200 via posts 215. Each post 215 can be connected to either an outer circular element 230 or an inner circular element 225 on one end, and to a capacitor 210, or a plurality of capacitors 210, on the other end of the post 215. Posts 215 can be inserted through the wall of the vacuum chamber 110 via openings in the vacuum chamber 110 walls. The antenna 205 to which posts 215 are connected can be inside the vacuum chamber 110 and capacitors 210 can be located at least partially outside of the vacuum chamber 110 or fully outside of the vacuum chamber 110. Feed through 220 components can provide pressure isolation (e.g., vacuum seal) around the posts 215 so that pressure from within the vacuum chamber 110 is not mixed or compromised with the pressure of the outside ambient (e.g., the air in which capacitors 210 are located). Feed-throughs 220 can be shaped to fit within the openings through which posts 215 are inserted and create a tight seal with both the walls of the vacuum chamber 110 and the outer side surface(s) of the posts 215.

A shield 240 can be disposed on top of, or above, the wall of the vacuum chamber 110 on the interior side of the vacuum chamber 110. Shield 240 can be shaped as a circle, or can resemble the shape of outer or inner circular elements 225 or 230. Shield 240 can be elongate and extend along the inner surface of the vacuum chamber 110 walls to protect various portions or components within the vacuum chamber 110, such as the feed-throughs 220 or posts 215. Shield 240 can extend beneath and parallel with the inner circular element 225 and/or outer circular element 230, protecting the post 215 and/or feed through 220 from any PVD material 130 deposition. Shield 240 can protect the feed throughs 220 from deposited PVD materials 130 to prevent short circuits between the posts 215 and the wall of the vacuum chamber 110. The region behind the antenna 205 and vacuum chamber 110 can include dielectric material to prevent plasma 255 from being formed behind the antenna 205 and maintain the plasma 255 in front of the antenna 205 (e.g., between the target 120 and wafer 140)

Example PVD System Configuration 2

The embodiment illustrated in FIG. 4 shows a configuration in which the inductive portion (e.g., antenna 205) of the resonant structure 200 is disposed within the vacuum chamber 110 along with a top portion (e.g., a first capacitor plate 245) of each of the capacitors 210, while the bottom portion (e.g., a second capacitor plate 245) of each of the capacitors 210 is disposed outside of the vacuum chamber 110. In some implementations, the illustrated configuration can be turned upside down so that the wafer can be beneath the antenna 205 and the capacitor structure. In some implementations, the configuration can be turned by 90 degrees so that the wafer is vertically oriented.

FIG. 4 includes a cross-sectional diagram of an example PVD system 100 in which an antenna 205 along with a portion of each of the capacitors 210 is disposed or located inside of the vacuum chamber 110, whereas the remaining portion of the capacitors 210 is disposed or located outside of the vacuum chamber 110 (e.g., in the ambient air). On the interior surface of the top wall of the vacuum chamber 110, a wafer location 260 with a wafer 140 can be disposed. Directly beneath the wafer 140 is plasma 255 which can be formed by antenna 205 laterally surrounding the target 120. Plasma 255 can include mirror currents 275 that can propagate through the plasma 255. Mirror currents 275 can be currents that are induced by the currents or power within the antenna 205. Mirror currents 275 can be formed by electromagnetic fields generated by the antenna 205 and can be shaped to mirror the shape of the currents in the antenna 205. Mirror currents 275 can therefore conform to the shape of the currents inside antenna 205. Mirror currents 275 can help heat up the region in which plasma 255 is formed so as to help maintain plasma 255.

PVD system 100 example illustrated in FIG. 4 depicts only a left side of a vacuum chamber 110 as the illustration is formed about an axis of symmetry. For this reason, a mirror image of the components of the PVD system 100 on the left side of the axis of symmetry can also extend to the right side of the axis of symmetry. For example, as FIG. 4 can refer to a cross-section of a circular antenna 205, the antenna 205 on the left side of the axis of symmetry can loop around and extend towards the right side of the axis of symmetry. Similarly, the capacitors 210, the target 120 and other illustrated components on the left side of the axis of symmetry can extend to the mirror image on the right side of the axis of symmetry.

Antenna 205 illustrated in the embodiment depicted in FIG. 4 can be electrically coupled to capacitors 210 inside of the vacuum chamber 110. Portions of the capacitors 210, such as for example, capacitor dielectrics 250 and/or capacitor plates 245, can be shielded from sputtered PVD materials 130 by the shield 240. One of the two capacitors plates 245 of each of the capacitors 210, such as the top capacitor plate 245, can be located inside of the vacuum chamber 110 (e.g., on the interior side of the wall of the vacuum chamber 110). Another capacitor plate 245, such as the bottom capacitor plate 245, can be located outside of the vacuum chamber 110 (e.g., on the exterior side of the wall of the vacuum chamber 110). The capacitor dielectric 250 separating and electrically insulating the two capacitor plates 245 can be disposed in line with the wall of the vacuum chamber 110. Therefore, one surface of the capacitor dielectric 250 can be exposed to the pressure of the interior of the vacuum chamber 110 and the other surface of the capacitor dielectric 250 can be exposed to ambient air. Resonant structure power 270 can power the capacitors 210 and the resonant structure 200.

Resonant structure power 270 can include any device, system, component or any combination of hardware and software for providing or coupling power, voltage or current to a resonant structure 200 and/or its antenna 205 or capacitors 210. Resonant structure power 270 can provide or couple power to any capacitor 210 or antenna 205. Resonant structure power 270 can include any combination of electrical circuitry and conductors for providing a set amount of power, voltage or current. Resonant structure power 270 can include a power supply or circuitry for powering a resonant structure 200 at a period or pulses in accordance with the resonant frequency of the resonant structure 200. Resonant structure power 270 can provide a direct current (DC) or constant power, such as anywhere between 100 W and 100,000 W. For example, resonant structure power 270 can provide up to 100 W, 200 W, 300 W, 400 W, 500 W, 700 W, 900 W, 1000 W, 5000 W, 10000 W, 50000 W or above 50000 W. Resonant structure power 270 can provide alternating current (AC) power. Resonant structure power 270 can provide constant voltage or power or an alternating voltage or power. Resonant structure power 270 can provide pulsed voltage, current or power, including pulsed power at any duty cycle between 0.1% and 50%. For example, resonant structure power 270 can provide pulses at up to 0.1% duty cycle, 0.5% duty cycle, 1% duty cycle, 2% duty cycle, 4% duty cycle, 5% duty cycle, 7% duty cycle, 10% duty cycle, 12% duty cycle, 15% duty cycle, 20% duty cycle, 25% duty cycle, 30% duty cycle, 40% duty cycle or 50% duty cycle.

Example PVD System Configuration 3

Figure 5:
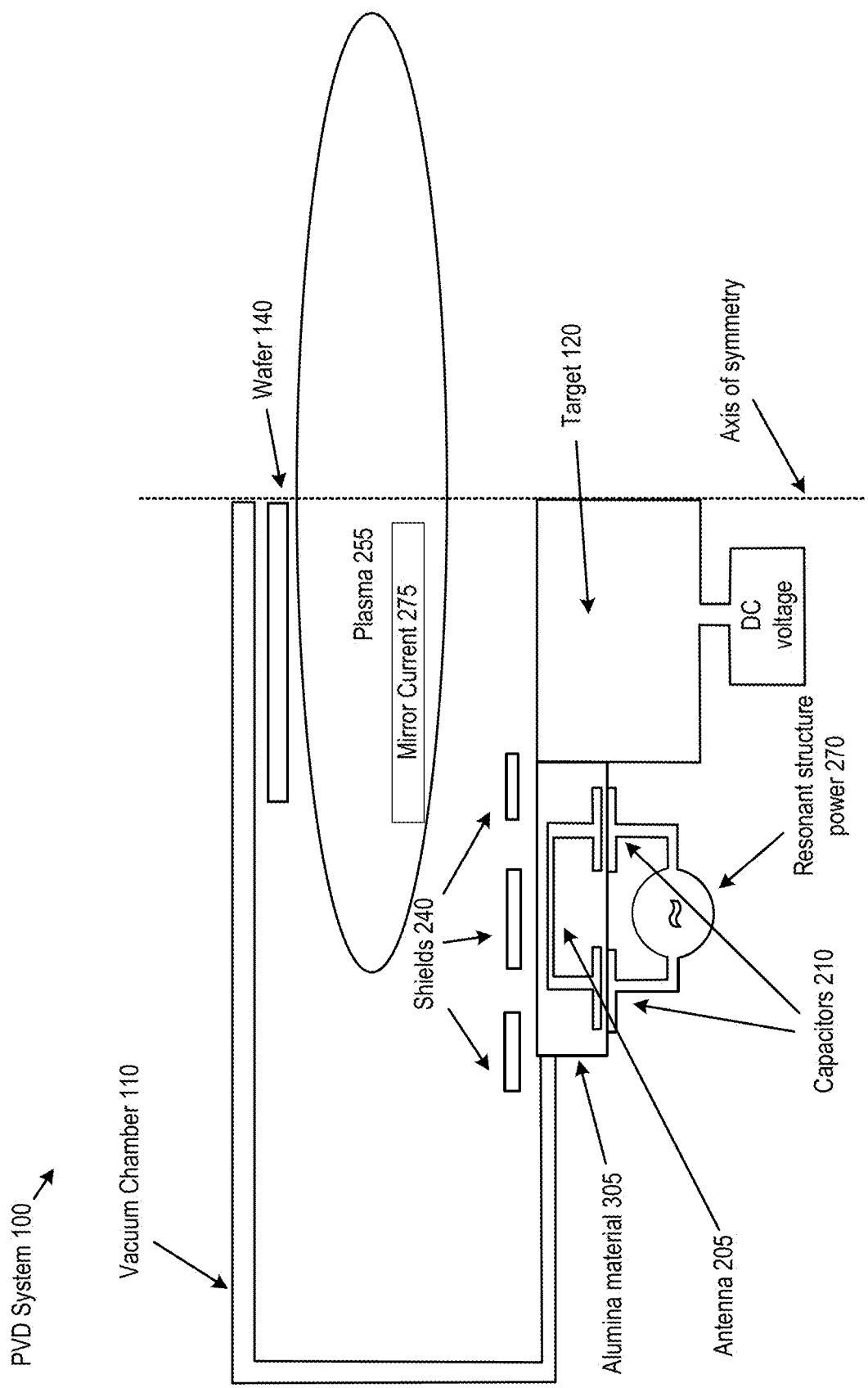
FIG. 5 includes a cross-sectional diagram of an example PVD system in which the resonant structure is outside of the vacuum chamber, in accordance with one or more embodiments.

The embodiment illustrated in FIG. 5 shows a configuration in which the entire resonant structure 200 is disposed outside of the vacuum chamber 110.

FIG. 5 includes a cross-sectional diagram of an example PVD system 100 in which the resonant structure 200 is disposed or located outside of the vacuum chamber 110. In the illustrated embodiment, the antenna 205 and at least a portion of the capacitors 210 can be embedded, enclosed or packaged within a block or enclosure of alumina material 305. A block or enclosure of alumina material 305 can enclose the antenna 205 and/or one or more capacitors 210. A surface of the block of alumina material 305 can be integrated into the wall of the vacuum chamber 110, so that this portion of the alumina material 305 is exposed to the interior pressure of the vacuum chamber 110. Antenna 205 can induce currents inside of the plasma 255, such as mirror currents 275 and the plasma 255 can be generated within the vacuum chamber 110 and through the alumina material 305, by the antenna 205. Resonant structure 270 can power the resonant structure 200 by powering the capacitors 210 at pulses in the resonant frequency of the resonant structure 200. One or more shields 240 can be disposed within the vacuum chamber 110 to protect one or more surfaces of within the vacuum chamber 110.

Example PVD System Configuration 4

Figure 7:
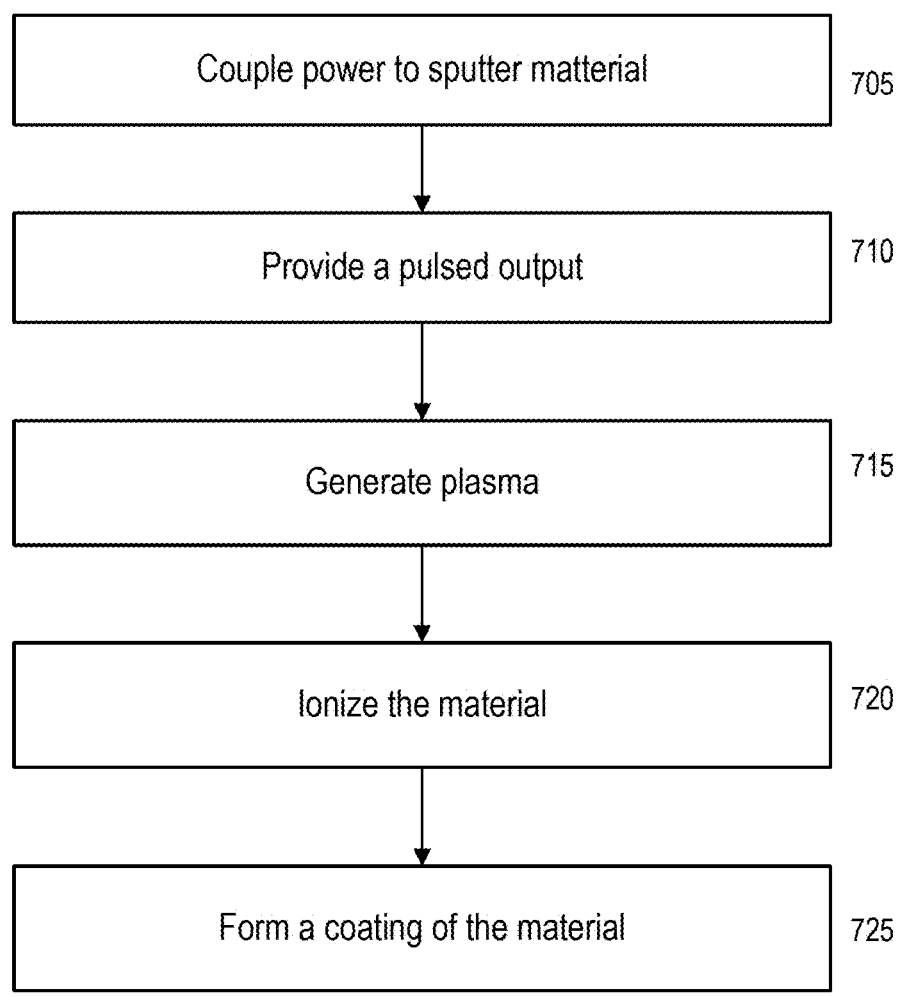
FIG. 7 includes an example method for performing PVD processing using the example systems and structures discussed in FIGS. 1-6, according to one or more embodiments.

The embodiment illustrated in FIGS. 7-8 shows a configuration in which the entire resonant structure 200 is disposed inside of the vacuum chamber 110.

Figure 6:
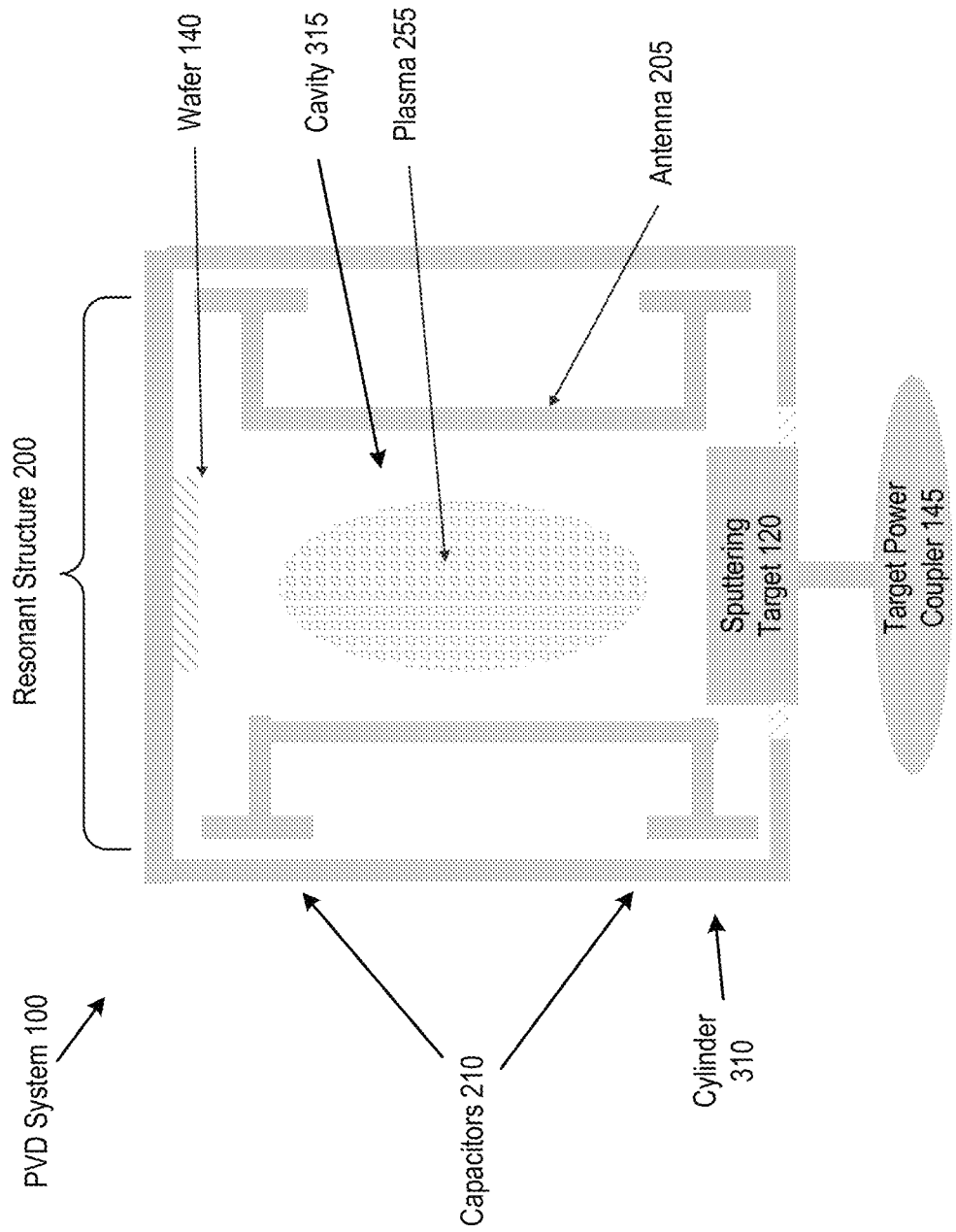
FIG. 6 includes an illustration of an example cylinder PVD system in which the resonant structure is inside of the vacuum chamber, in accordance with one or more embodiments.

FIG. 6 includes an illustration of an example cylinder PVD system 100 in which the resonant structure 200 is formed in a shape of a cylinder 310 inside of a vacuum chamber 110. Resonant structure 200 can include antenna 205 that can include multiple element connectors 235 lining out the inner surface of the cylinder 310. Antenna 205 can include elements of electrically conductive material that are shaped into multiple loops or are shaped to form multiple spirals. The looped or spiraled shaped elements of antenna 205 can form or resemble the shape of a cylinder. The elements of antenna 205 connect the lower part of the capacitor structure 210 to the upper part of the capacitor structure 210. Capacitors 210 can line up the outer surface of the cylinder 310 structure and be electrically coupled to each end of the antenna 205. Cylinder 310 can include an inner cavity 315 that can be defined by the inner enclosure of the cylinder 310. Within the inner cavity 315 of the cylinder 310 plasma 255 can be formed by cylindrically shaped antenna 205. In the embodiment illustrated in FIG. 6, entire resonant structure 200 can be disposed within the vacuum chamber 110.

In the cross-sectional view of FIG. 6, a cross-section of the cylinder 310 of the resonant structure 200 is shown. In the illustrated embodiment, antenna 205 lines up the inner surface 315 of the cylinder 310. Antenna 205 can turned towards the interior cavity 315 to form plasma 255 and mirror currents 275 within the cavity 315. Behind antenna 205 towards the outer side of the cylinder 310 one or more capacitors 210 can be located completing the resonant structure 200. Alternatively, one or more capacitors 210 can connected to the antenna 205 via or from the outer surface of the cylinder 310.

In some implementations, the present solution can be implemented in a high-power impulse magneton sputtering (HiPIMS) system. For example, a PVD system 100 can include a HiPIMS system or a tool in which PVD can be utilized based on magnetron sputter deposition. HiPIMS can use high power densities on the order of one or more $kW \times cm^{-2}$ which can be provided in short pulses of tens of microseconds at low duty cycles. For example, a HiPIMS PVD system 100 can utilize duty cycles of 10% or less. For example, a PVD system 100 using HiPIMS methodology can include a pulsed magnetron applied to target 120 at instantaneous power of about 10 kW to about 100 kW (e.g., 60 kW) which can be provided at up to 10% duty cycle (e.g., 10% duty cycle). The resulting plasma 255 produced can have density of about 1e13 $cm^{-3}$.

In one aspect, the present solution relates to a PVD system 100, such as a semiconductor equipment tool utilizing plasma 255. PVD system 100 can include a vacuum chamber 110 for performing a physical vapor deposition (PVD) on a wafer 140. PVD system 100 can include a target 120 located within the vacuum chamber 110 for sputtering a PVD material 130 onto a wafer 140. PVD system 100 can include a resonant structure 200. The resonant structure can include or by formed by an antenna 205 and one or more capacitors 210. The resonant structure 200 can be configured (e.g., have its electrical components connected) so as to provide a pulsed output (e.g., electromagnetic radiation) at a resonant frequency of the resonant structure 200. The resonant structure 200 can be configured to generate, via the antenna 205 and based on the pulsed output, a plasma 255 between the target 120 and a location of the wafer 260. The plasma 255 can ionize the PVD material 130 sputtered from the target 120.

PVD system 100 can include the wafer 140 that is electrically charged to accelerate the sputtered PVD material 130 ionized by the plasma 255. For example, the wafer 140 and/or wafer location 260 can be set at a voltage potential that attracts ionized PVD material 130 particles towards the wafer 140. PVD system 100 can include the antenna 205 that is configured to induce a mirror current 275 around the antenna 205 to generate heat to sustain the plasma 255.

PVD system 100 can include at least a portion of the plurality of capacitors 210 that is located outside of the vacuum chamber 110. PVD system 100 can include a post 215 that electrically couples a plate 245 of a capacitor 210 of the plurality of capacitors 210 with the antenna 205. PVD system 100 can include a feed through 220 surrounding the post 215 and insulating a pressure within the vacuum chamber 110 from a pressure of external ambient air.

PVD system 100 can include at least a part of the antenna 205 that is located within the vacuum chamber 110. PVD system 100 can include at least a part of the antenna 205 that is located outside of the vacuum chamber 110. PVD system 100 can include a part of the antenna 205 that is enclosed within alumina material 305 and at least a portion of the alumina material 305 is exposed to interior of the vacuum chamber 110.

PVD system 100 can include the resonant structure 200 that is configured to operate at a resonant frequency. The resonant frequency can be at least in part defined by the inductance of the antenna 205 and the capacitance of the plurality of capacitors 210 electrically coupled with the antenna 205. PVD system 100 can include the resonant structure 200 that is configured to generate, via the antenna 205, one of a magnetic field or an electric field at the resonant frequency, the one of the magnetic field or the electric field of the antenna 205 generating the plasma 255.

PVD system 100 can include the plurality of capacitors 210 that comprise two capacitors 210 that are electrically connected with each other in a series electrical connection. The two capacitors 210 can be electrically connected with the antenna 205 in the same series electrical connection. PVD system 100 can include the antenna 205 that is axisymmetric and that generates plasma 255 with azimuthal symmetry with respect to the antenna 205. For example, plasma 255 can resemble or reflect the shape of the antenna 205.

PVD system 100 can include the antenna that includes at least two circular elements (e.g., 225 and 230). The two circular elements (e.g., 225 and 230) can be connected with each other by a plurality of elongate connectors 235. The two circular elements 225 and 230 can be concentric and coplanar with each other. The plurality of elongate connectors 235 can be curved to form a spiral shape between the two circular elements 225 and 230. PVD system 100 can include the antenna 205 and the plurality of capacitors 210 that are located within the vacuum chamber 110 and further include one or more shields 240 for protecting at least a portion of the plurality of capacitors 210. PVD system 100 can include the antenna and the plurality of capacitors 210 are shaped into a cylinder 310 inside of the vacuum chamber 110. The resonant structure 220 can be shaped into a cylinder 310 and configured to form the plasma 255 within an interior cavity 315 of the cylinder 310.

PVD system 100 can include two power sources that can initiate a plasma on their own or enhance a pre-existing plasma. For example, PVD system 100 can include a power source connected to the target 120 (e.g., target power coupler 145) and a power source connected to the resonant structure (e.g., resonant structure power 270). If one of the two power sources (e.g., power source 145 or 270) is in a CW mode, then both can be on at the same time. If one of the two power sources (e.g., power source 145 or 270) is in pulsed mode, such as, for example, in HiPIMS, then either one of the two power sources can be turned on first or they can both be turned on together. In some implementations, it can be advantageous to first turn on the resonant structure power supply 270 and then to turn on the target power supply 145 since doing so can avoid some of the arcing transients that can occur in HiPIMS configurations.

Referring now to FIG. 7, illustrated is a flow diagram of an example method 700. Method 700 can be a method for generating plasma, for a process, such as a PVD process. The method 900 can be implemented in accordance with embodiments illustrated and discussed in connection with FIGS. 1-6. The method 700 can include steps 705-725. At step 705, a power can be coupled to sputter a material. At step 710, a pulsed output can be provided. At step 715, plasma can be generated. At step 720, material can be ionized. At step 725, a coating of the material can be formed.

At step 705, method 700 can couple a power to sputter a material. Method 700 can couple power to a target within a vacuum chamber for PVD to sputter a material. The method can include powering or turning on a target power coupler. The method can include powering or turning on a resonant structure power supply. In some embodiments, the resonant structure power supply can be powered or turned on prior to the turning on of the target power coupler. In response to powering one of or both of the target power coupler or the resonant structure power supply, the material can be sputtered. Sputtered material can include atoms or molecules detached or removed from target. The target can be disposed or located inside of a vacuum chamber. The target can include a circular, elliptical, polygonal or any other shape. The target can be surrounded by an antenna that is a part of a resonant structure. The sputtered material can be a material from the target. The power can be used to operate a device to cause sputtering of the material. To create sputtering, the method can any device, such as a laser, a plasma generator or a heater. Power can be coupled to a target power coupler to power the sputtering. The antenna can provide plasma that can improve sputtering from the target.

At step 710, method 700 can provide a pulsed output. Method 700 can provide, by a resonant structure formed by an antenna and a plurality of capacitors, a pulsed output at a resonant frequency of the resonant structure. Pulsed output can include one or more electromagnetic radiation. Pulsed output can be at a duty cycle. The duty cycle can be for example at up 10%, such as at up to 0.1%, 0.5%, 1%, 2%, 3%, 5%, 7%, 8% or 10%. The duty cycle can be at more than 10%. The pulsed output can generate currents within the antenna of the resonant structure. The currents within the antenna can provide or induce a magnetic field or an electric field from the antenna. For example, pulsed output can include electric or magnetic fields pulsed from the antenna. For example, the pulsed output can include electromagnetic pulses at the resonant frequency generated from the antenna. The resonant frequency can be a frequency defined by any combination of the resistive, inductive and capacitive components of the resonant structure.

At step 715, method 700 can generate a plasma. Method 700 can generate, by the antenna, a plasma between the target and a location of the wafer based on the pulsed output. The antenna can include a shape, such as a circle, ellipse, square, rectangle, oval, or any polygon, such as a triangle, rectangle, hexagon, octagon or any other shape. The plasma generated by the antenna can mirror or resemble the shape of the antenna. For example, the plasma formed above the antenna can also be shaped as a volumetric shape resembling a circle, ellipse, square, rectangle oval, or any polygon. The method can induce a mirror current around the antenna to generate heat and sustain the plasma. The method can generate, by the antenna of the resonant structure, one of a magnetic field or an electric field at the resonant frequency, where the one of the magnetic field or the electric field generates the plasma. The plasma can be generated by electromagnetic output of the antenna, which can be provided at the resonant frequency of the resonant structure. Antenna can provide inductive component and one or more capacitors of the resonant structure can provide capacitive components to define the resonant frequency.

At step 720, method 700 can ionize the material. The method 900 can include ionizing, by the plasma, the material sputtered from the target. The material sputtered from the target can be ionized inside the volumetric area in which plasma is formed. The material can be ionized at ionization events 134. In an ionization event 134, a sputtered particle (e.g., atom or a molecule) can collide or otherwise interact with an electron or an ionized atom or a molecule within the plasma. At the ionization event 134, the sputtered particle can become ionized and acquired a positive or a negative charge.

At step 725, method 700 can form a coating of the material. The method 700 can include electrically charging the wafer to attract the sputtered material ionized by the plasma. The method can include coating the wafer with a layer of ionized material. The layer of coated material can be formed on a wafer that can be disposed in the wafer location. The wafer location and the wafer can be charged at a voltage potential or a charge that is opposite to that of the ionized sputtered particles. The wafer location and the wafer can attract the ionized sputtered particles. The ionized sputtered particles can accelerate towards the wafer and collide with the surface of the wafer at a uniform distribution, thereby forming a uniform film or coating of the sputtered material.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features described only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A system comprising:
   a vacuum chamber for physical vapor deposition (PVD);
   a target located within the vacuum chamber for sputtering a material onto a wafer; and
   a resonant structure formed by an antenna and a plurality of capacitors, wherein the antenna of the resonant structure is coplanar with a top surface of the target and the resonant structure is configured to:
   provide a pulsed output at a resonant frequency of the resonant structure; and
   generate, via the antenna and based on the pulsed output, a plasma between the target and a location of the wafer to ionize the material sputtered from the target.

2. The system of claim 1, wherein the wafer is electrically charged to accelerate the sputtered material, ionized by the plasma, toward the wafer.

3. The system of claim 1, wherein the antenna is configured to induce a mirror current around the antenna and generate heat to sustain the plasma.

4. The system of claim 1, wherein at least a portion of the plurality of capacitors is located outside of the vacuum chamber.

5. The system of claim 1, further comprising:
   a post electrically coupling a plate of a capacitor of the plurality of capacitors with the antenna; and
   a feed through surrounding the post and insulating a pressure within the vacuum chamber from a pressure of external ambient air.

6. The system of claim 1, wherein at least a part of the antenna is located within the vacuum chamber.

7. The system of claim 1, wherein at least a part of the antenna is located outside of the vacuum chamber.

8. The system of claim 1, wherein at least a part of the antenna is enclosed within alumina material and at least a portion of the alumina material is exposed to interior of the vacuum chamber.

9. The system of claim 1, wherein the resonant structure is configured to operate at a resonant frequency, the resonant frequency at least in part defined by an inductance of the antenna and a capacitance of the plurality of capacitors.

10. The system of claim 1, wherein the resonant structure is configured to generate, via the antenna, one of a magnetic field or an electric field at the resonant frequency, the one of the magnetic field or the electric field of the antenna generating the plasma.

11. The system of claim 1, wherein the plurality of capacitors comprises two capacitors that are electrically connected with each other in a series electrical connection and wherein the two capacitors are electrically connected with the antenna in the series electrical connection.

12. The system of claim 1, wherein the antenna comprises a geometry that is symmetric about an axis of the antenna and generates plasma based on geometry of the antenna.

13. The system of claim 1, wherein the antenna comprises at least two circular elements, the two circular elements connected with each other by a plurality of elongate connectors.

14. The system of claim 13, wherein the two circular elements are concentric and coplanar with each other and wherein the plurality of elongate connectors are curved to form a spiral shape between the two circular elements.

15. The system of claim 1, wherein the antenna and the plurality of capacitors are located within the vacuum chamber and further comprising one or more shields for protecting at least a portion of the plurality of capacitors.

16. The system of claim 15, wherein the antenna and the plurality of capacitors are shaped into a cylinder inside of the vacuum chamber, and wherein the resonant structure is configured to form the plasma within an interior cavity of the cylinder.

17. A method comprising:
   coupling, to a target within a vacuum chamber for physical vapor deposition (PVD), electrical power to sputter a material onto a wafter;
   providing, by a resonant structure formed by an antenna and a plurality of capacitors, a pulsed output at a resonant frequency of the resonant structure, wherein the antenna of the resonant structure is coplanar with a top surface of the target;
   generating, by the antenna, a plasma between the target and a location of the wafer based on the pulsed output; and
   ionizing, by the plasma, the material sputtered from the target.

18. The method of claim 17, further comprising
   electrically charging the wafer to attract the sputtered material ionized by the plasma; and
   coating the wafer with a layer of ionized material.

19. The method of claim 17, further comprising inducing a mirror current around the antenna to generate heat and to sustain the plasma.

20. The method of claim 17, further comprising generating, by the antenna of the resonant structure, one of a magnetic field or an electric field at the resonant frequency, the one of the magnetic field or the electric field generating the plasma.

* * * * *